United States Patent
Bales (10) Patent No.: US 6,639,424 B2
(45) Date of Patent: Oct. 28, 2003

(54) COMBINED DYNAMIC LOGIC GATE AND LEVEL SHIFTER AND METHOD EMPLOYING SAME

(75) Inventor: Tim Bales, Bracknell (GB)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/942,681

(22) Filed: Aug. 31, 2001

(65) Prior Publication Data

US 2003/0042932 A1 Mar. 6, 2003

(51) Int. Cl.[7] .......................................... H03K 19/0185
(52) U.S. Cl. ............................ 326/63; 326/68; 326/83; 326/81
(58) Field of Search ........................ 326/56–58, 80, 326/81, 83, 86, 112, 119, 121

(56) References Cited

U.S. PATENT DOCUMENTS

| | | | |
|---|---|---|---|
| 5,225,718 A | 7/1993 | Seshita et al. | |
| 5,568,062 A | 10/1996 | Kaplinsky | |
| 5,834,948 A | * 11/1998 | Yoshizaki et al. | ............ 326/81 |
| 5,867,052 A | 2/1999 | Austin et al. | |
| 5,894,238 A | 4/1999 | Chien | |
| 6,118,301 A | * 9/2000 | Singh et al. | ............ 326/58 |
| 6,177,824 B1 | 1/2001 | Amanai | |

FOREIGN PATENT DOCUMENTS

WO        WO 96/07238        3/1996

* cited by examiner

*Primary Examiner*—Don Le
(74) *Attorney, Agent, or Firm*—Dickstein Shapiro Morin & Oshinsky LLP (57) ABSTRACT

An apparatus and associated method are provided for combining a dynamic logic gate and level shifting circuitry in an improved circuit. The combined dynamic logic gate and level shifting circuit of the invention includes a pair of logic gates each having an output and configured such that only one output of the pair is applied at a time to a respective one of a pair of output switching circuits coupled to receive the outputs of the logic gates, wherein a pair of inputs which transition in a first voltage range control the logic gates to produce an output which transitions in a second voltage range in response to the switching of the output switching circuits.

63 Claims, 6 Drawing Sheets

COMBINED DYNAMIC LOGIC GATE AND LEVEL SHIFTER AND METHOD EMPLOYING SAME

FIELD OF THE INVENTION

The present invention relates to improving the performance of logic gates in an integrated circuit, and more particularly, to a combined dynamic logic gate and level shifting circuit.

BACKGROUND OF THE INVENTION

Semiconductor manufacturers are under increasing pressure to improve the capacity and performance of semiconductor devices. For example, memory devices having an increasing number of individual memory elements are in demand, as well as devices that function at increased operating speeds.

One consequence of this pressure is that all semiconductor operations are under increased scrutiny to determine where performance improvements may be gained. Among the many semiconductor operations being examined are speed, input loading, and the amount of wasted current.

Digital logic circuits, including complementary metal-oxide-semiconductor (CMOS) circuits, have traditionally suffered from high input loading requirements and current waste. For example, circuits formed with classic logic techniques, such as the NAND gate of FIG. 1 (described in more detail below), are generally simple, but require high input loading and waste current during transitioning between output states. In order to have a high output drive strength, the transistors in a simple classic logic circuit must generally be physically large. Such a configuration requires that the inputs must also be driven by a relatively large device. Also, in classic logic circuits no attempt is made to limit the supply current spikes that flow through the transistors when, during transitions from one output state to another, all transistors are switched simultaneously.

Figure 3:
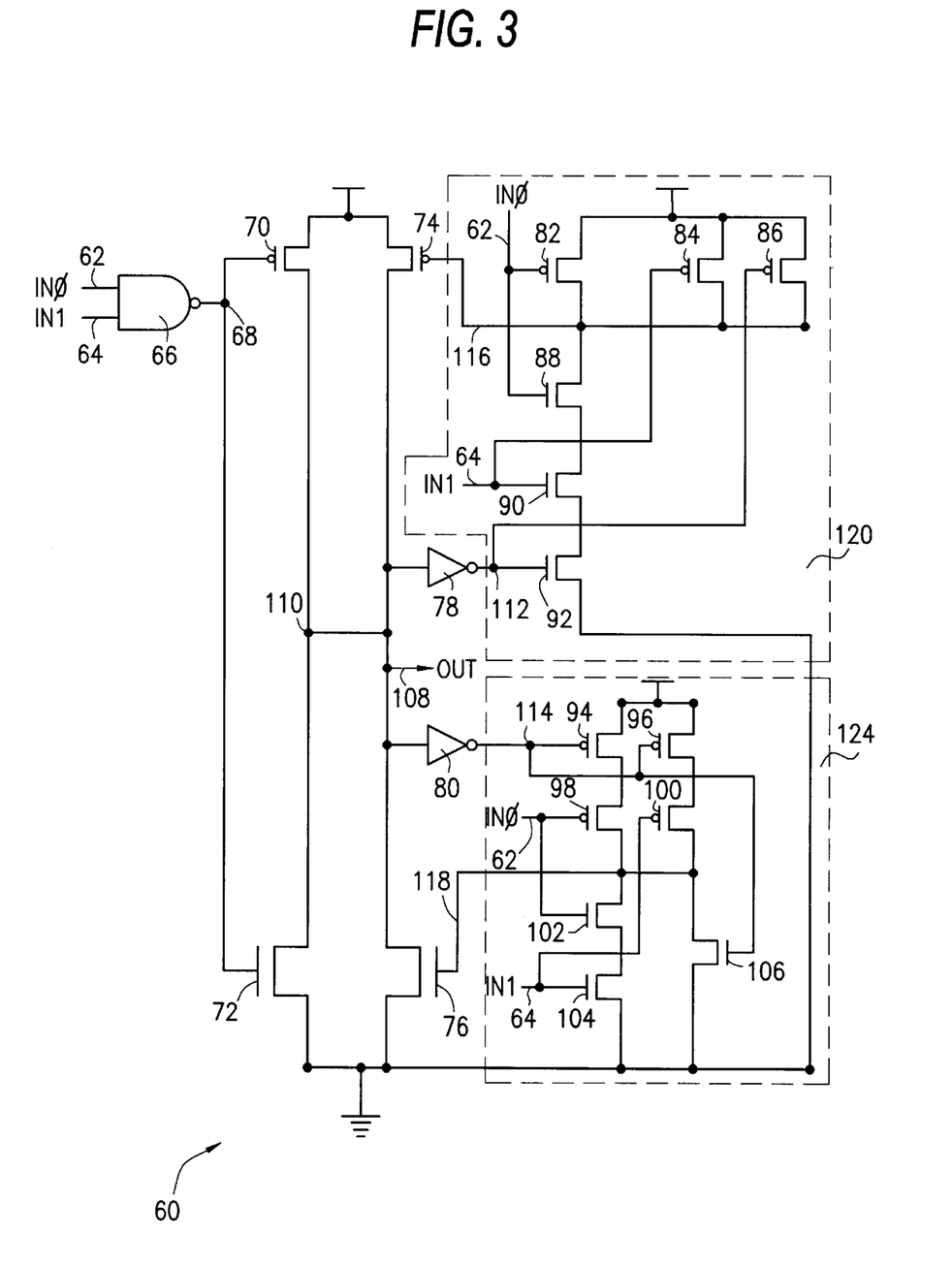
FIG. 3 illustrates a schematic diagram of a dynamic AND logic circuit.

One approach to solving the input loading and current waste problems is to use a dynamic logic gate topology as represented by the AND gate of FIG. 3. In FIG. 3, which is described in more detail below, the arrangement of dynamic logic circuits employs non-overlapping output transitioning and avoids simultaneous switching of all transistors to avoid current waste. Non-overlapping output transitioning is accomplished by configuring the circuit such that one of VDD and ground may be connected to the output, but never both at the same time. Dynamic logic circuits also exhibit very fast output switching due to this non-overlapping operation. In addition, dynamic logic circuits can be formed using moderately-sized transistors at the input, reducing input loading requirements.

Dynamic logic circuits represent an improvement over classic logic circuits, but still require a separate level shifting circuit in order to be used with load devices that operate within a different range of voltages. For example, if the dynamic logic circuit operates within a range of 0–1.8 volts and is to be used to drive a load device that operates within a range of 0–3.3 volts, a separate level shifting circuit would be required.

Accordingly, there is a strong desire and need to improve logic gates provided in integrated circuits by providing a combined dynamic logic gate having a non-overlapping operation and a level shifting circuit.

BRIEF SUMMARY OF THE INVENTION

An apparatus and associated method are provided to improve the performance of logic gate circuits by combining dynamic logic circuit technology having a non-overlapping operation with level shifting circuit technology, thereby improving input loading, supply current, and switching speed characteristics.

In one aspect of the invention, a level shifting logic circuit is provided which includes a pair of logic gates each having an output and configured such that only one output of the pair is applied at a time to a respective one of a pair of output switching circuits coupled to receive the outputs of the logic gates, wherein a pair of inputs which transition in a first voltage range control the logic gates to produce an output which transitions in a second voltage range in response to the switching of the output switching circuits.

In another aspect of the invention, a method of operating a logic circuit is provided which includes providing first and second logic output signals transitioning within a first voltage range in response to at least one input logic signal which transitions within the first voltage range, providing at a logic circuit a third logic output signal which transitions within a second voltage range which differs from the first voltage range in response to first and second control signals applied as inputs to the logic circuit, and selectively applying the first and second logic output signals as the first and second control signals to the logic circuit in a manner which prevents simultaneous application of the first and second control signals to the logic circuit.

BRIEF DESCRIPTION OF THE DRAWINGS

These and other features of the invention will be more clearly understood from the following detailed description of the invention which is provided in conjunction with the accompanying drawings.

DETAILED DESCRIPTION OF THE INVENTION

The present invention comprises an apparatus and method for shifting a voltage level and performing a logical operation in a digital logic circuit. In order to better understand each of the aspects of the invention, the following includes a description of a classic logic circuit (FIG. 1), a dynamic logic circuit (FIG. 3), and a classic level shifting circuit (FIG. 2). Then, exemplary embodiments of the invention including combined dynamic logic and level shifting circuits will be described with reference to FIGS. 4–6.

Figure 1:
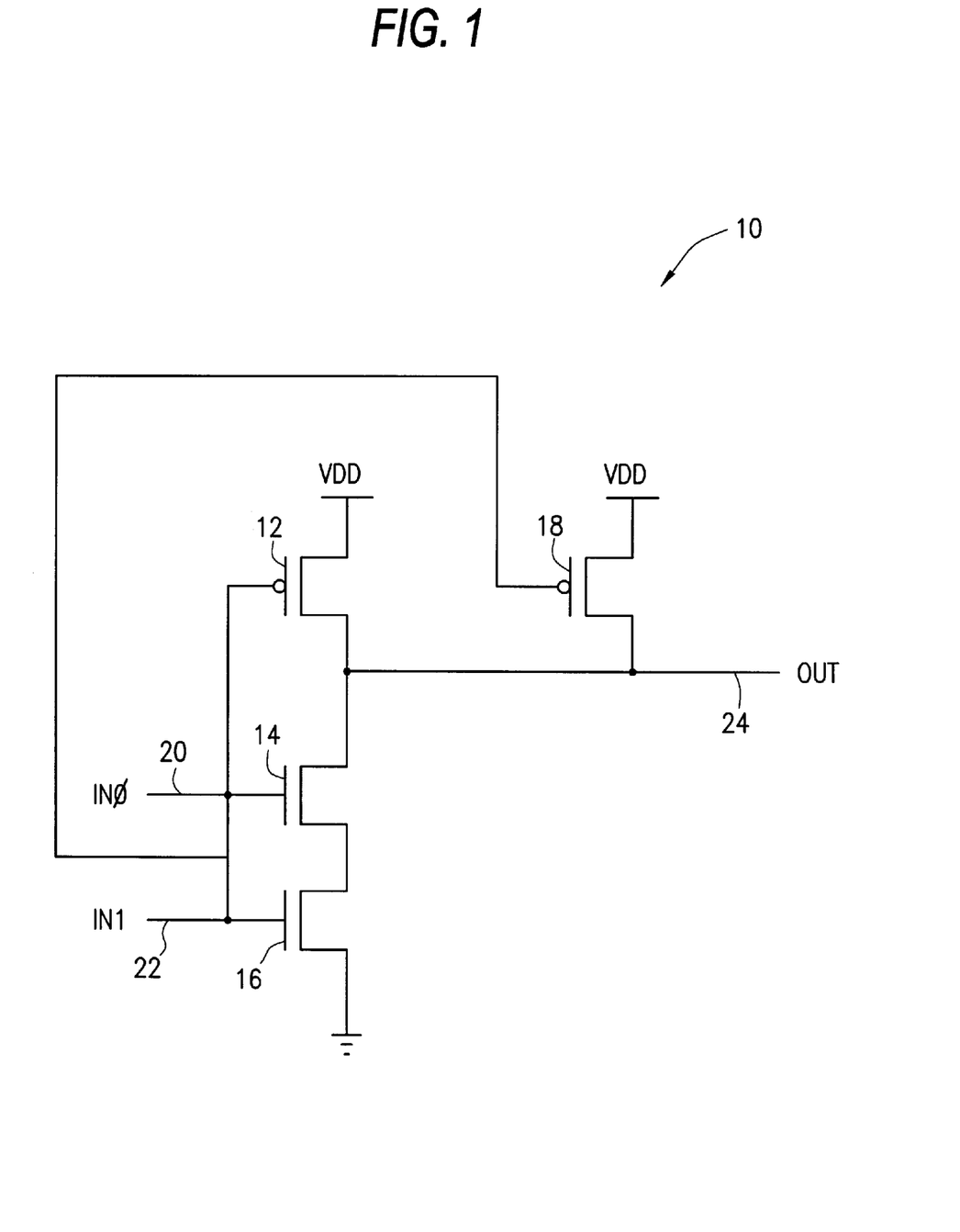
FIG. 1 illustrates a schematic diagram of a conventional classic NAND logic circuit.
Figure 2:
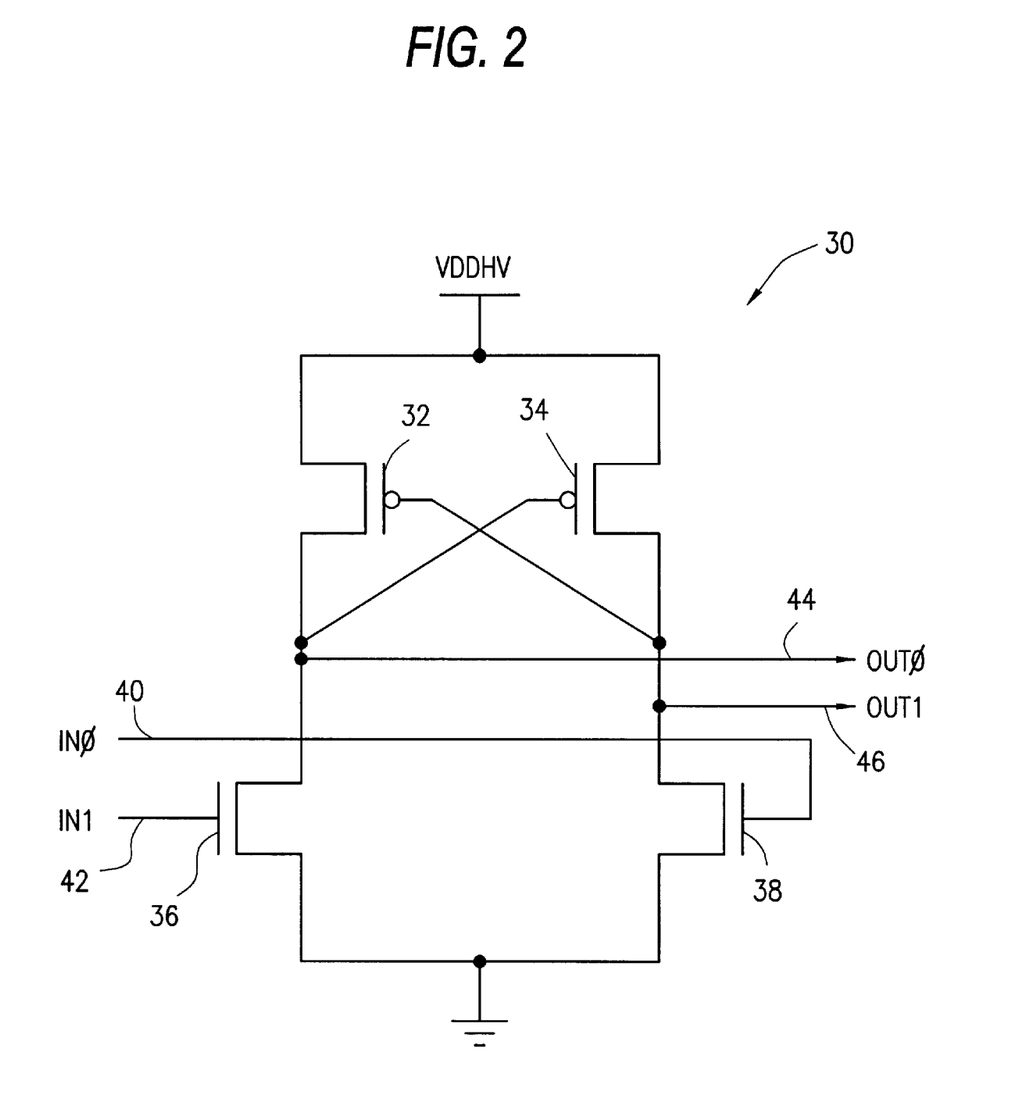
FIG. 2 illustrates a schematic diagram of a conventional classic level shifting circuit.

FIG. 1 shows a NAND logic circuit 10 formed using classic logic techniques. The first 20 and second inputs 22 are coupled to the gates of respective n-channel transistors 14, 16, and respective p-channel transistors 12, 18. The first p-channel transistor 12 has a source coupled to a first reference voltage (e.g., VDD) and a drain coupled to a drain of the first n-channel transistor 14. A source of the first n-channel transistor 14 is coupled to a drain of the second n-channel transistor 16, which has a source coupled to a second reference voltage (e.g., ground). The second p-channel transistor 18 is coupled between the first reference voltage (e.g., VDD) and an output 24, which is also coupled to the junction of the drain of the first p-channel transistor 12 and the drain of the first n-channel transistor 14.

In operation, when either or both of the inputs 20, 22 are low (logic "0"), at least one of the p-channel transistors 12, 18 is turned on and will connect the first reference voltage (e.g., VDD) to the output 24 (i.e., output 24 is high (logic "1")). When both inputs 20, 22 are high (logic "1"), the p-channel transistors 12, 18 are turned off and the n-channel transistors 14, 16 are turned on, connecting the second reference voltage (e.g., ground) to the output 24 (i.e., output 24 is low (logic "0")). Thus, the circuit of FIG. 1 acts as a NAND gate.

The circuit of FIG. 1 has the advantage of simplicity, but it suffers from the dual problems of high input loading requirements and current waste. In order to have a high output drive strength, each of the transistors 12, 14, 16, 18 must be physically large. This configuration requires that the inputs 20, 22 themselves must be driven by a relatively large device. As for wasted current, no attempt is made to limit the supply current spikes that flow through both the n-channel 14, 16 and p-channel transistors 12, 18 when, during transitions from one output state to another, all transistors are switched on simultaneously.

One approach to solving the input loading and current waste problems is to use a dynamic logic gate topology which avoids the simultaneous switching of all transistors. FIG. 3 illustrates a dynamic AND logic circuit 60 with non-overlapping output 108 transitioning. The inputs 62, 64 are coupled to a NAND gate 66 which has an output coupled to the gates of transistors 70, 72. The transistors 70, 72 form a minimum size inverter that performs a 'holder' function. Output switching is performed using the large series-connected driving transistors 74, 76, each of which has a gate respectively coupled to the outputs of NAND circuits 120, 124. Each of the NAND circuits 120, 124 are coupled to both inputs 62, 64. A drain of the first large driving transistor 74 is coupled to a drain of the second large driving transistor 76, and the junction is coupled to the output 108. The output 108 is also coupled to the input of inverters 78, 80 associated with the NAND circuits 120, 124, respectively.

The first NAND circuit 120 includes three p-channel transistors 82, 84, 86 and three n-channel transistors 88, 90, 92. The first input 62 is coupled to the gates of the first p-channel transistor 82 and the first n-channel transistor 88. The second input 64 is coupled to the gates of the second p-channel transistor 84 and the second n-channel transistor 90. The output 112 of the first inverter 78 is coupled to the gates of the third p-channel transistor 86 and the third n-channel transistor 92. The p-channel transistors 82, 84, 86 are connected in parallel between a first reference voltage (e.g., VDD) and a NAND gate output 116. The n-channel transistors 88, 90, 92 are connected in series between a second reference voltage (e.g., ground) and the NAND gate output 116.

The second NAND circuit 124 includes four p-channel transistors 94, 96, 98, 100, and three n-channel transistors 102, 104, 106. The first input 62 is coupled to the gates of the first p-channel transistor 98 and the first n-channel transistor 102. The second input 64 is coupled to the gates of the second p-channel transistor 100 and the second n-channel transistor 104. The output 114 of the second inverter 80, which has an input coupled to output 108, is coupled to the gates of the third and fourth p-channel transistors 94, 96 and the third n-channel transistor 106. The first and third p-channel transistors 98, 94 are connected in series between the first reference voltage (e.g., VDD) and the output 118. The second and fourth p-channel transistors 96, 100 are connected in series between the first reference voltage (e.g., VDD) and the NAND gate output 118, and in parallel with the first and third p-channel transistors 98,94. The first and second n-channel transistors 102, 104 are connected in series between a second reference voltage (e.g., ground) and the NAND gate output 118. The third n-channel transistor 106 is connected in series between the second reference voltage (e.g., ground) and the NAND gate output 118, and in parallel with the first and second n-channel transistors 102, 104.

The holder transistors 70, 72 are coupled together in a mininum size inverter configuration and connected in parallel with the large driving transistors 74, 76, and the coupled drain/drain of the holder transistors 70, 72 are connected to the coupled drain/drain of the large driving transistors 74, 76 and to output terminal 108.

In operation, the inverters 78, 80 perform an enabling function with respect to the NAND circuits 120, 124 and ensure that the NAND gate outputs 116, 118 are non-overlapping with respect to each other. With this configuration, the NAND gate outputs 116, 118 are only 'primed to switch' when an opposite state exists at the output terminal 108. For example, when output 108 is low (logic "0"), first inverter output 112 is high (logic "1"), and thus in the first NAND circuit 120 the third n-channel transistor 92 is gated high to permit coupling the second reference voltage (e.g., ground) to the NAND gate output 116 to turn on the large driving transistor 74 (i.e., it is primed to switch the output 108 high). At the same time, second inverter output 114 is high (logic "1"), and thus in the second NAND circuit 124 the third and fourth p-channel transistors 94, 96 are not gated and do not permit coupling of the first reference voltage (e.g., VDD) to the NAND gate output 118, turning off the large driving transistor 76 (i.e., it is not primed to switch the output 108).

Because only one of the NAND gate outputs 116, 118 is primed to switch at a time, the large driving transistors 74, 76 can never be gated on simultaneously. Thus, only one of the large driving transistors 74, 76 may switch at a time, thus avoiding current waste due to both driving transistors 74, 76 being turned on at the same time, for example, during a change in state at the output terminal 108. This non-overlapping characteristic of the dynamic AND logic circuit 60 significantly reduces wasted supply current and increases switching speed.

The first and second inverters 78, 80 are "skewed switching point" inverters or dynamic delay elements. If skewed switching point inverters are used, the absolute switching point will normally be chosen at a small point away (e.g., one VT) from the final value of the output node to ensure that node 108 reaches (very nearly) its final value before the large switching MOS 74, 76 are inhibited. The use of skewed switching point inverters will cause the circuit 60 to have increased recovery time (i.e., the point where circuits 120 or 124 are properly inhibited/primed to switch). This type of switching is not required, however, and alternatively dynamic delay elements may instead be utilized to optimize recovery time. However, the use of dynamic delay elements is only recommended when the load on the output node 108 can be limited. If the load on the output node 108 exceeds that characterized for the cell 60, there is a risk that the large switching MOS 74, 76 will be removed too soon, thereby causing the output node 108 to take a long time to reach the final logic level value. This would be disadvantageous because the output node has less noise immunity when the output is not at the final value.

The dynamic AND logic circuit 60 shown in FIG. 3 has several advantages over classical logic circuits, such as the NAND gate depicted in FIG. 1. The input loading requirements of the dynamic circuit of FIG. 3 are moderate because the inputs 62, 64 are loaded only by the minimum size AND gate 66 formed by the transistors 70, 72 and by medium sized transistors in the NAND circuits 120, 124. The input loading may be decreased even further by using smaller size transistors in the NAND circuits 120, 124, but this may cause a relative increase in recovery time, adversely impacting circuit speed. The circuit 60 also exhibits very low supply current waste. Because the large transistors 74, 76 change states in a non-overlapping manner, the only wasted supply current is that which occurs in the minimum size inverter formed by transistors 70, 72 and in the medium size NAND circuits 120, 124. The circuit 60 also exhibits very fast output switching due to the non-overlapping operation of the large driving transistors 74, 76.

FIG. 2 shows a conventional classic level shifting circuit 30 having differential (complementary) inputs 40, 42 which transition within a first voltage range (e.g., 0-VDD), and differential (complementary) outputs 44, 46 which transition within a second voltage range (e.g., 0-VDDHV) but having the same logical states as the inputs 40, 42. The classic level shifting circuit 30 includes two n-channel transistors 36, 38, and two p-channel transistors 32, 34. The first differential input 40 is coupled to the gate of the second n-channel transistor 38, and the second differential input 42 is coupled to the gate of the first n-channel transistor 36. Sources of each of the first and second n-channel transistors 36, 38 are coupled together and are coupled to a second reference voltage (e.g., ground). A drain of the first n-channel transistor 36 is coupled to a drain of the first p-channel transistor 32 and to a first output 44. A drain of the second n-channel transistor 38 is coupled to a drain of the second p-channel transistor 34 and to a second output 46. Sources of each of the first and second p-channel transistors 32, 34 are coupled together and are coupled to a first reference voltage of a second voltage level/domain (e.g., VDDHV). The gate of the first p-channel transistor 32 is coupled to the second output 46, and the gate of the second p-channel transistor 34 is coupled to the first output 44.

In operation, differential signals whose voltage level is to be shifted to the level of VDDHV are applied to inputs 40, 42. One of the complementary inputs 40, 42 will turn on one of the n-channel transistors 36, 38, while the other of the n-channel transistors 38, 36 will be turned off. This will couple one of the outputs 44, 46 to the second reference voltage (e.g., ground), turning on one of the p-channel transistors 32, 34 to couple the other output 46, 44 to the first reference voltage of the second voltage domain (e.g., VDDHV).

For example, if the first input 40 is low (logic "0") and second input 42 is high (logic "1"), the first n-channel transistor 36 is turned on and thus the first output 44 is pulled low (logic "0") by connection to the second reference voltage (e.g., ground). The first output being low (logic "0") turns on the second p-channel transistor 34, coupling the second output 46 to the first reference voltage of the second voltage domain (e.g., VDDHV).

When the circuit 30 of FIG. 2 changes states, the compromises required in forming the circuit 30 become more apparent. For example, as the first input 40 transitions from low to high (logic "1") and second input 42 transitions from high to low (logic "0"), the second n-channel transistor 38 is turned on and works against the second p-channel transistor 34, pulling the voltage at the second output 46 downwards. At the same time, the first n-channel transistor 36 is turned off. As the voltage at the second output 46 falls, the first p-channel transistor 32 is turned on and the second p-channel transistor 34 is turned off by the rising voltage at the first output 44. Thus, the states of the outputs 44, 46 transition to high (logic "1") at the first output 44 and low (logic "0") at the second output 46.

The disadvantages of the classic level shifting circuit 30 of FIG. 2 are that, due to the compromises required in specifying the transistors to balance the operation of the circuit 30 with regard to parasitic and load capacitance, etc., the slew-rate achievable at the outputs 44, 46 is poor. By choosing weak or small p-channel 32, 34 or n-channel transistors 36, 38, the speed of the low-to-high transition, or the speed of the high-to-low transition, may be improved, but not both at the same time. Thus, there is a need to develop a level shifting circuit more susceptible of performance improvement.

Figure 4:
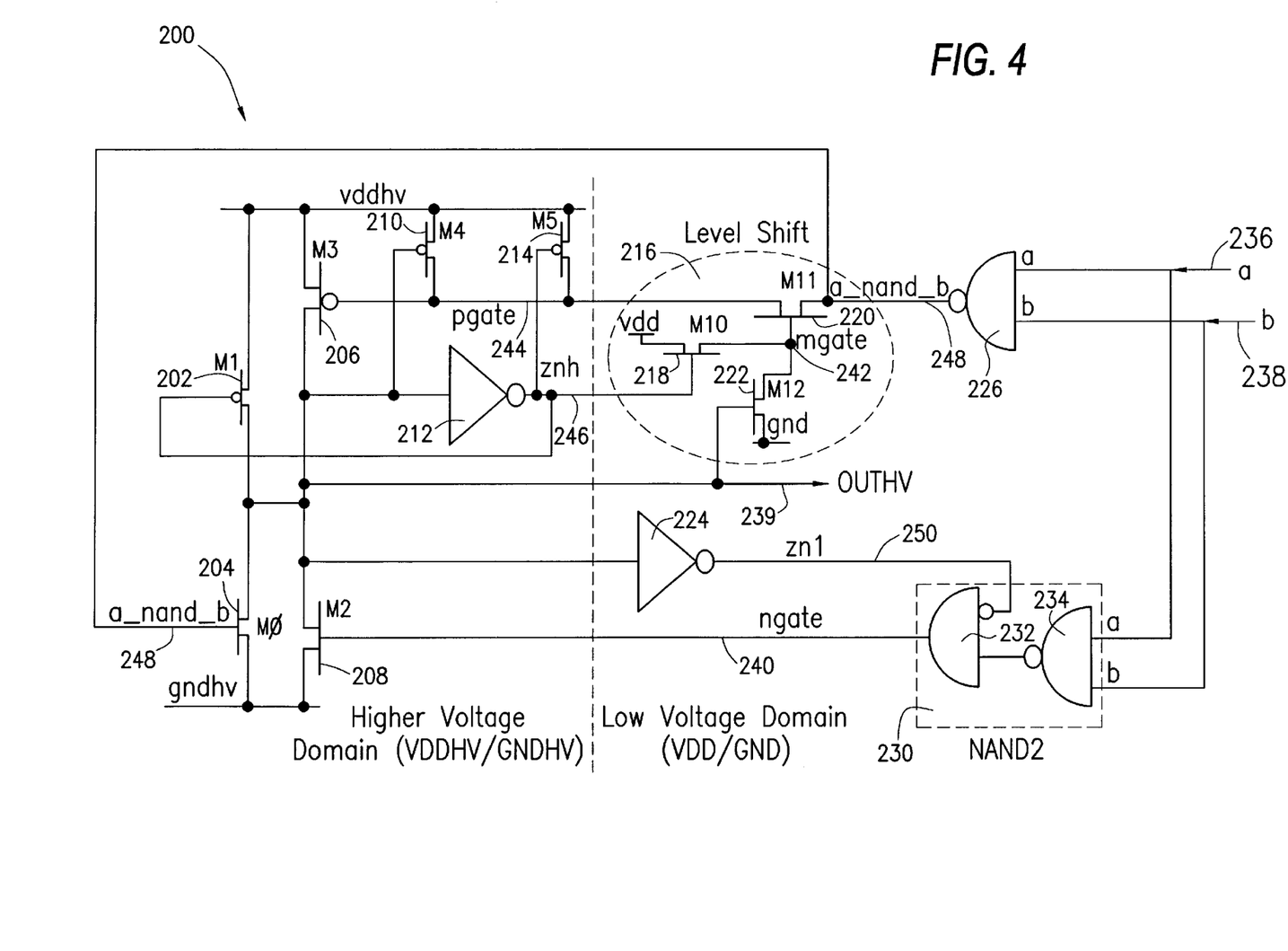
FIG. 4 illustrates a schematic diagram of a dynamic AND logic circuit with inherent level shifting formed in accordance with an exemplary embodiment of the invention.

Exemplary embodiments of the invention provide a more flexible level shifting logic circuit structure, for example, a circuit structure susceptible of transition speed improvement while exhibiting very low wasted supply current. FIG. 4 illustrates an exemplary embodiment of a dynamic AND logic circuit 200 with inherent level shifting formed in accordance with an exemplary embodiment of the invention. The AND circuit 200 includes first and second NAND circuits 226, 234 each coupled to first and second inputs 236, 238. The output 248 of the first NAND circuit 226 is coupled to a pgate signal line 244 through a first enabling circuit 216. The output of the second NAND circuit 234 is coupled through a second enabling circuit 232 to the ngate signal line 240. The first enabling circuit 216 includes first n-channel transistor 220, second n-channel transistor 218, and third n-channel transistor 222. A source of the first n-channel transistor 220 is coupled to the output 248 of the first NAND circuit 226, and a drain of transistor 220 is coupled to the pgate signal line 244 which is coupled to the gate of a first driving transistor 206. The gate of the first n-channel transistor 220 is coupled to the mgate signal line 242, which is coupled to a drain of the second n-channel transistor 218 and drain of the third n-channel transistor 222. A source of the second n-channel transistor 218 is coupled to a first reference voltage (e.g., VDD) having a first low voltage level (e.g., a low voltage of 1.8 volts), and the gate of the second n-channel transistor 218 is coupled to the znh signal line 246. A source of the third n-channel transistor 222 is coupled to a second reference voltage (e.g., ground), and the gate is coupled to the output 239. The voltages VDD and ground define a first low voltage range (e.g., 0 to VDD) within which the input signals 236, 238 transition The AND circuit 200 includes first and second large driving transistors 206, 208, respectively, and first and second small holder transistors 202, 204, respectively. As an example, first and second large driving transistors 206, 208 may be p- and n-channel transistors, respectively, and first and second small holder transistors 202, 204, may be p- and n-channel transistors, respectively. First small holder transistor 202 and first large driving transistor 206 each have a source coupled to a first reference voltage (e.g., VDDHV) of a second voltage level higher than VDD (e.g., a high voltage of 3.3 volts), and a drain coupled to the output 239. Second small holder transistor 204 and second large driving transistor 208 each have a source coupled to a second reference voltage (e.g., ground GNDHV), and a drain coupled to the output 239. The gate of the first small holder transistor 202 is coupled to the znh signal line 246, and the gate of the second small holder transistor 204 is coupled to the output 248 of the first NAND circuit 226. The gate of the first large driving transistor 206 is coupled to the pgate signal line 244 (i.e., the enabled output of the first NAND circuit 226 and the first enabling circuit 216), and the gate of the second large driving transistor 208 is coupled to the ngate signal line 240 (i.e., the enabled output of the second NAND circuit 234 and the second enabling circuit 232). Together, the second enabling circuit 232 and the second NAND circuit 234 make up an enabled NAND circuit 230. The voltages VDDHV and GNDHV define a second high voltage range (e.g., 0 to VDDHV) within which the output signal OUTHV transitions.

The AND circuit 200 includes first and second skewed inverters 212, 224, respectively, each having an input coupled to the output 239. The output of the first inverter 212 is coupled to the znh signal line 246, which is coupled to the first enabling circuit 216. The output of the second inverter 224 is coupled to the znl signal line 250, which is coupled to the second enabling circuit 232.

The AND circuit 200 also includes third and fourth small holder transistors 210, 214 connected in parallel between the first reference voltage (e.g., VDDHV) of the second voltage level (e.g., 3.3 volts) and the pgate signal line 244. The gates of the third 210 and fourth 214 small holder transistors are coupled to the input 239 (e.g., output 239) and output 246 (i.e., znh signal line 246) of the first inverter 212, respectively. The AND circuit 200 produces a level-shifted (higher voltage (e.g., 0 to VDDHV), AND logic operation result at output 239 in response to the low voltage (e.g., 0 to VDD) inputs 236, 238.

In operation, the small sized inverter formed by the first and second small holder transistors 202, 204 performs a 'holder' function. In other words, switching of the output 239 is performed using the large driving transistors 206, 208, and the small holder transistors 202, 204 hold the output 239 at the current state. The gates of the large driving output transistors 206, 208 are driven by the nodes pgate 244 and ngate 240, respectively, which are the enabled outputs of the NAND circuits 226, 234. Similar to the dynamic AND logic circuit 60 described with reference to FIG. 3, only one NAND circuit output 226, 234 may turn on a driving transistor 206, 208 at a time. Thus, this configuration is non-overlapping, and the large driving output transistors 206, 208 are each primed to switch only when an opposite state exists at the output 239.

For example, a low to high transition of the output 239 will now be described. If either or both of the inputs 236, 238 are low (logic "0"), the output 239 will be low (logic "0") (i.e., the circuit 200 functions as an AND gate). The inverters 212, 224 will cause the znh 246 and znl 250 signal lines to be high (logic "1"). The high znl signal line 250 turns off the second enabling circuit 232 to disable the output of the second NAND circuit 234, while the high znh signal line 246 turns on the second n-channel transistor 218, which turns on the first n-channel transistor 220. Thus, the output 248 of the first NAND circuit 226 is primed to switch the pgate signal line 244. Because either or both of the inputs 236, 238 is low (logic "0"), the output of the first NAND circuit 226 is high (logic "1"), turning off the first large driving transistor 206. Because the output 239 is low (logic "0"), the pgate signal line 244 is held weakly high by the third small holder transistor 210. The transistor 214 is off due to the high (logic "1") state at the output 246 of inverter 212, and a high (logic "1") signal is applied to the gate of transistor 204.

For an output low-to-high transition, both first and second inputs 236, 238 transition high (logic "1"). The output 248 of the first NAND circuit 226 transitions low (logic "0"), pulling the pgate signal line 244 low (logic "0"). The low pgate signal line 244 will turn on the first large driving transistor 206, pulling the output 239 high (logic "1"). Because output 248 of the first NAND circuit 226 is now low, the second holder transistor 204 is turned off. At the same time, the inverter 212 causes the znh signal line 246 to be low, turning on the first holder transistor 202 and thus coupling the output 239 to the first reference voltage (e.g., VDDHV) to hold the output 239 at the second voltage level (e.g., 3.3 volts). In addition, the low znh signal line 246 turns off the first n-channel transistor 218, and the high output 239 turns on the third n-channel transistor 222, pulling the mgate signal line 242 low (logic "0"). Thus, the first n-channel transistor 220 is turned off and the first enabling circuit 216 causes the NAND circuit 226 to no longer be primed to switch the output 239. When transistor 220 is turned off a low signal is no longer supplied from line 248 to the transistor 206, and the output signal 239 is held high by transistor 202. The low output of inverter 212 turns on transistor 214 to force the line pgate 244 to go high keeping transistor 206 off.

As the output 239 is high, the inverter 224 causes the znl signal line 250 to be low (logic "0"), turning on the second enabling circuit 232. Thus, the second NAND circuit 234 is now primed to switch the output 239 via its coupling to the gate of the second large driving transistor 208 via the ngate signal line 240.

A high to low transition of the output 239 will now be described. If both of the inputs 236, 238 are high (logic "1"), the output 239 will be high (logic "1") (i.e., the circuit 200 functions as an AND gate). The inverters 212, 224 will cause the znh 246 and znl 250 signal lines to be low (logic "0"). The low znl signal line 250 turns on the second enabling circuit 232 to enable the output of the second NAND circuit 234, while the low znh signal line 246 turns off the second n-channel transistor 218, which turns off the first n-channel transistor 220. Thus, the output 248 of the first NAND circuit 226 is not primed to switch the pgate signal line 244. Because both of the inputs 236, 238 are high (logic "1"), the output of the second NAND circuit 234 is low (logic "0"), turning off the second large driving transistor 208. Because the output 239 is high (logic "1"), the pgate signal line 244 is held weakly high by the fourth small holder transistor 214. The transistor 210 is off due to the high (logic "1") state at the output 239, and a low (logic "0") signal is applied to the gate of transistor 204. The output is held weakly high by the first small holder transistor 202, which is gated by the low (logic "0") znh signal 246.

For an output high-to-low transition, one or both of first and second inputs 236, 238 transition low (logic "0"). The output 248 of the first NAND circuit 226 transitions high (logic "1"), turning on the transistor 204, which starts to weakly pull the output 239 low (logic "0"). Simultaneously, the output of the second NAND circuit 234 will turn on the second large driving transistor 208. This couples the output 239 to a second reference voltage of the second voltage domain (e.g., GNDHV). Since the output 248 of the first NAND circuit 226 is now high, the second holder transistor 204 is on, and holds the output 239 low. At the same time, the inverter 212 causes the znh signal line 246 to transition high, turning off the first holder transistor 202. In addition, the high znh signal line 246 turns on the first n-channel transistor 218, and the low (logic "0") output 239 turns off the third n-channel transistor 222, pulling the mgate signal line 242 high (logic "1"). Thus, the first n-channel transistor 220 is turned on and the first enabling circuit 216 causes the NAND circuit 226 to be primed to switch the output 239. The low output 239 turns on transistor 210 to force the line pgate 244 to go high keeping transistor 206 off.

As the output 239 is low (logic "0"), the inverter 224 causes the znl signal line 250 to be high (logic "1"), turning off the second enabling circuit 232. Thus, the second NAND circuit 234 is not primed to switch the output 239.

The inverters 212, 224 are "skewed switching point" inverters or dynamic delay elements. As previously noted the use of skewed switching point inverters may be desirable if the load at the output cannot be accurately characterized, while dynamic delay element may be preferred if the load at the output can be limited.

The circuit 200 provides level shifting due to the inputs 236, 238 transitioning within a first voltage range (i.e., 0 to VDD), and the output 239 transitioning within a second voltage range (i.e., 0 to VDDHV). Exemplary values of VDD and VDDHV may be 1.8 volts and 3.3 volts, respectively. Level shifting takes place for the circuit 200 because transitions of the inputs 236, 238 cause selective coupling of a first reference voltage (VDDHV) or a second reference voltage (ground) to the output 239 through the large driving transistors 206, 208. The first and second NAND circuits 226, 234 are so sized to be responsive to the range of voltages (e.g., 0 to VDD) of the inputs 236, 238.

The circuit 200 illustrated in FIG. 4 exhibits several advantages over conventional logic gates and level shifting circuits. The input loading requirements of the circuit 200 are moderate, because the transistors which form NAND gates 226, 230 may be sized to favor low-to-high or high-to-low switching at, for example, nodes 244 and 240. For example, when MOS 206 is activated, node 244 should ideally have a fast high-to-low transition in order to switch on MOS 206 as fast as possible. When circuit 216 inhibits the output of NAND gate 226, we can usually tolerate a much slower rise time on node 248. Thus the p-channel transistors of NAND gate 226 can be made small to minimize input loading. Likewise, when MOS 208 is activated, node 240 should ideally have a fast low-to-high transition in order to switch on MOS 208 as fast as possible. When circuit 232 inhibits the output of NAND gate 234, we can usually tolerate a much slower fall time on node 240. Thus the n-channel transistors of NAND gate 230 can be made small to minimize input loading.

The circuit 200 also exhibits very low wasted supply current due in part to the non-overlapping switching of the large driving transistors 206, 208. Among the few sources of current waste is the small holder transistor 202, but its small size reduces the amount of wasted supply current.

Figure 5:
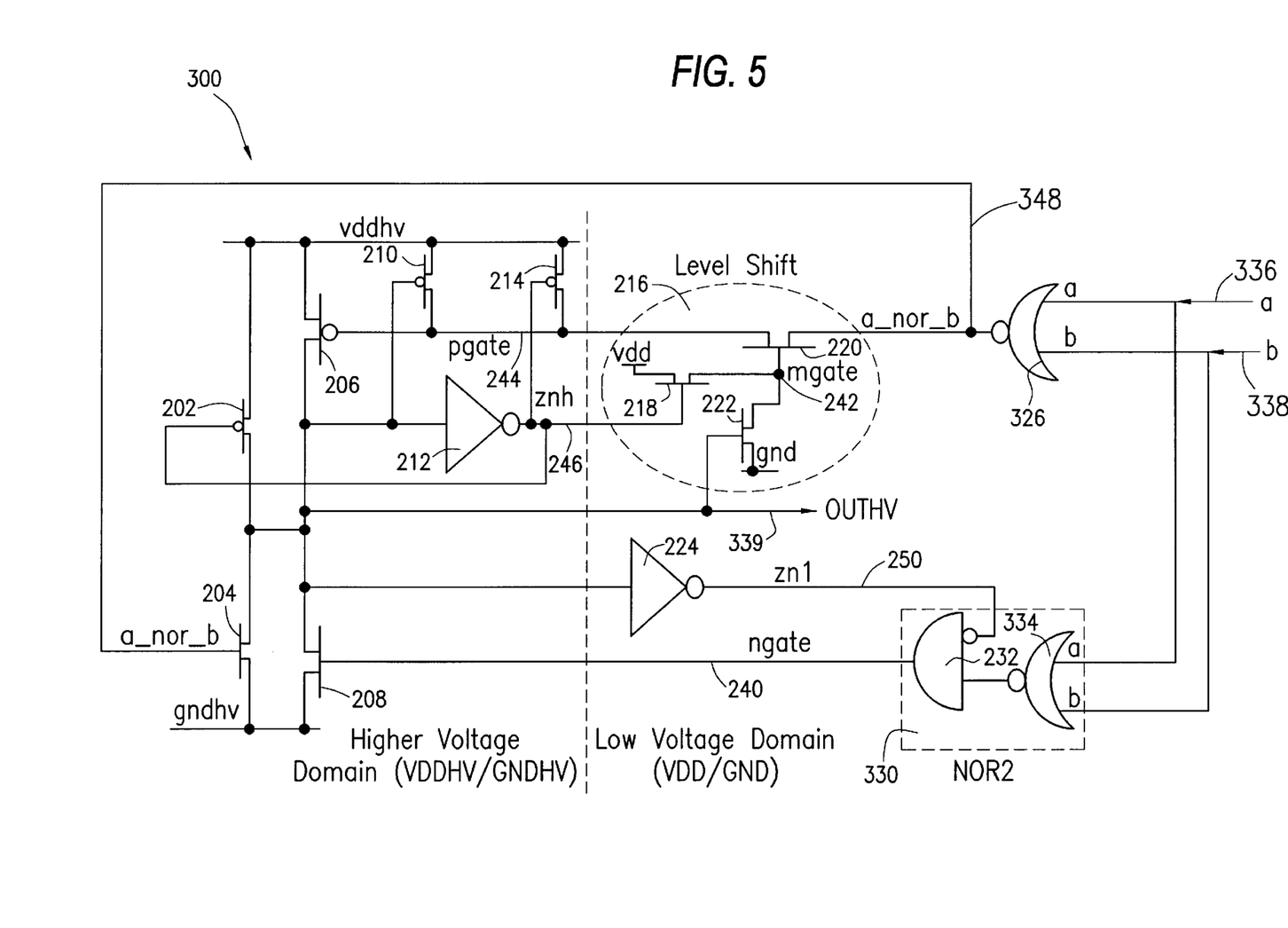
FIG. 5 illustrates a schematic diagram of a dynamic OR logic circuit with inherent level shifting formed in accordance with another exemplary embodiment of the invention.

FIG. 5 illustrates an exemplary embodiment of another dynamic logic circuit 300 with inherent level shifting formed in accordance with another exemplary embodiment of the invention. The circuit 300 includes the same circuit elements as the circuit 200 illustrated in FIG. 4, except that the inputs 336, 338 are coupled to first and second NOR circuits 326, 334. The first 326 and second 334 NOR circuits are coupled to first and second enabling circuits 216, 232, respectively. The circuit 300 acts as an OR gate, rather than as an AND gate (FIG. 4), and produces an output 339 of the second voltage level (e.g., 3.3 volts) which is the result of a logical OR operation on the inputs 336, 338 of the first voltage level (e.g., 1.8 volts). In other respects, the OR circuit 300 operates in a manner identical to that described for the AND circuit 200.

It should be understood that the invention may easily be adapted to perform a variety of other logic functions in addition to "AND" and "OR," for example, exclusive OR, NAND, and NOR.

Figure 6:
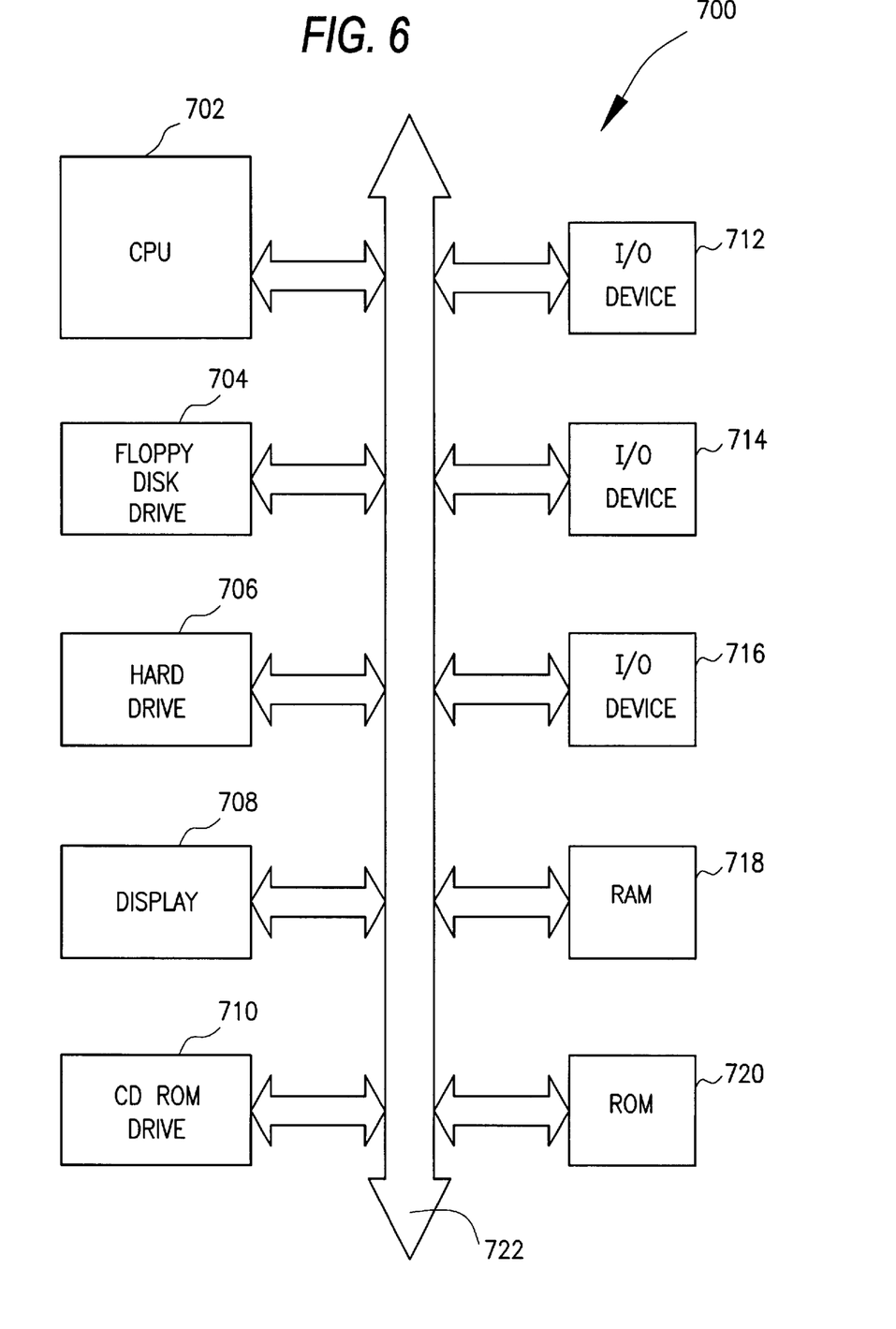
FIG. 6 illustrates a processor system formed in accordance with another exemplary embodiment of the invention.

FIG. 6 illustrates an exemplary processor system 700 which may include a dynamic logic circuit with inherent level shifting in accordance with the exemplary embodiments of the invention. Referring to FIG. 6, the processor system 700, which may be a computer system, for example, generally comprises a central processing unit (CPU) 702, for example, a microprocessor, that communicates with one or more input/output (I/O) devices 712, 714, 716 over a system bus 722. The computer system 700 also includes random access memory (RAM) 718, a read only memory (ROM) 720 and, in the case of a computer system may include peripheral devices such as a floppy disk drive 704, a hard drive 706, a display 708 and a compact disk (CD) ROM drive 710 which also communicate with the processor 702 over the bus 722. One or more of CPU 702, RAM 718, ROM 720, and the electronic circuits of 704, 706, 708 and 710 includes a circuit having at least one dynamic logic circuit with inherent level shifting constructed in accordance with the invention. It should also be noted that FIG. 6 is merely representative of many different types of processor system architectures which may employ the invention, and that the central processing unit 702 and RAM 718 may be combined on a single integrated circuit chip.

Dynamic logic circuits 200, 300 with inherent level shifting capability have been described that improve the performance of integrated circuits by combining a logic gate with a level shifter circuit exhibiting reduced input loading, reduced wasted supply current, and increased speed. These and other advantages are achieved by forming a pair of logic gates each having an output and configured such that only one output of the pair is applied at a time to a respective one of a pair of output switching circuits coupled to receive the outputs of the logic gates, wherein a pair of inputs which transition within a first voltage range control the logic gates to produce an output which transitions within a second voltage range in response to the switching of the output switching circuits.

While the invention has been described and illustrated with reference to specific exemplary embodiments, it should be understood that many modifications and substitutions can be made without departing from the spirit and scope of the invention. Accordingly, the invention is not to be considered as limited by the foregoing description but is only limited by the scope of the appended claims.

What is claimed as new and desired to be protected by Letters Patent of the United States is:

1. A level shifting logic circuit, comprising:
   a pair of logic gates each having an output and configured such that only one output of said pair is applied at a tune to a respective one of a pair of output switching circuits coupled to receive said outputs of said logic gates;
   a pair of inputs, which transition in a first voltage range, to control said logic gates to produce a third output which transitions in a second voltage range, in response to the switching of said output switching circuits;
   wherein said output switching circuits include first and second driving transistors, said first driving transistor being a p-channel transistor, and said second driving transistor being an n-channel transistor, said first and second driving transistors being serially connected with the series connection providing said third output; and a pair of series connected holder transistors coupled between first and second voltages which define said second voltage range, the series connection point of said holder transistors being connected to said third output.

2. A circuit as in claim 1, further comprising a pair of parallel connected holder transistors coupled between a first voltage defining one endpoint of said second voltage range and a gate of one of said output switching transistors.

3. A level shifting logic circuit, comprising:

a pair of logic gates each having an output and configured such that only one output of said pair is applied at a time to a respective one of a pair of output switching circuits coupled to receive said outputs of said logic gates; and a pair of inputs, which transition in a first voltage range, to control said logic gates to produce a third output which transitions in a second voltage range, in response to the switching of said output switching circuits;

wherein said first and second logic gates are OR logic gate circuits, and said third output provides an OR logic function output.

4. A level shifting logic circuit, comprising:

a pair of logic gates each having an output and configured such that only one output of said pair is applied at a time to a respective one of a pair of output switching circuits coupled to receive said outputs of said logic gates; and a pair of inputs, which transition in a first voltage range, to control said logic gates to produce a third output which transitions in a second voltage range, in response to the switching of said output switching circuits wherein said pair of output switching circuits include first and second series connected driving transistors, a source of said first driving transistor being coupled to a reference voltage source which defines one endpoint of said second voltage range, and a drain of said second transistor being coupled to another reference voltage source which defines another endpoint of said voltage range, said first and second driving transistors are not turned on at the same time, and, each of said pair of logic gates are configured to apply a respective one of said output signals only when said third output signal has a state opposite to a state of a respective enabling signal coupled to a respective one of said first and second logic gates.

5. A level shifting logic circuit, comprising:

a pair of logic gates each having an output and configured such that only one output of said pair is applied at a time to a respective one of a pair of output switching circuits coupled to receive said outputs of said logic gates;

a pair of inputs, which transition in a first voltage range, to control said logic gates to produce a third output which transitions in a second voltage range, in response to the switching of said output switching circuits; and a first and a second inverters, each having an input coupled to said third output signal, said first inverter having an output coupled as an enabling control signal to a first of said pair of logic gates, and said second inverter having an output coupled as an enabling control signal to a second of said pair of logic gates.

6. A circuit as in claim 5, wherein said first and second inverters are skewed inverters such that each of said first and second inverter outputs transition logic states approximately as soon as a respective inverter input voltage varies from an initial voltage.

7. A circuit as in claim 5, wherein said first and second inverters are skewed inverters such that each of said first and second inverter outputs transition logic states approximately when a respective inverter input voltage varies nearer to a final voltage from an initial voltage at said inverter input.

8. A circuit as in claim 5, further comprising a selective application transistor coupled between a first of said logic gate outputs and a first of said output switching circuits, said selective application transistor being controlled by said first inverter output and said third output signal.

9. A circuit as in claim 8, wherein said gate of said selective application transistor is coupled to a second reference voltage source having a voltage within said first voltage range through a first enable transistor having a gate coupled to said first inverter output.

10. A circuit as in claim 9, wherein said gate of said selective application transistor is coupled to a first reference voltage source through a second enable transistor having a gate coupled to said third output signal.

11. A level shifting logic circuit, comprising:

a pair of logic gates each having an output and configured such that only one output of said pair is applied at a time to a respective one of a pair of output switching circuits coupled to receive said outputs of said logic gates; and a pair of inputs, which transition in a first voltage range, to control said logic gates to produce a third output which transitions in a second voltage range, in response to the switching of said output switching circuits;

wherein said first and second logic gates are NAND logic gate circuits and said third output provides an AND logic function output.

12. A level shifting logic circuit, comprising:

a first logic circuit responsive to at least one applied logic signal for producing a first output signal which transitions within a first voltage range;

a second logic circuit responsive to said at least one applied logic signal for producing a second output signal which transitions within said first voltage range;

a third logic circuit responsive to first and second control signals for providing at an output a third output signal which transitions within a second voltage range different from said first voltage range;

a first switching circuit for selectively applying said first output signal as said first control signal to said third logic circuit; and a second switching circuit for selectively applying said second output signal as said second control signal to said third logic circuit;

said first and second switching circuits operating such that said third logic circuit does not receive said first and second control signals simultaneously.

13. A circuit as in claim 12, wherein said third logic circuit includes first and second series connected driving transistors, a source of said first driving transistor being coupled to a reference voltage source which defines one endpoint of said second voltage range, and a drain of said second driving transistor being coupled to another reference voltage source which defines another endpoint of said second voltage range.

14. A circuit as in claim 13, wherein said first and second switching circuits are configured to apply said first and second output signals in a non-overlapping manner such that said first and second driving transistors are not turned on at the same time.

15. A circuit as in claim 14, wherein each of said first and second switching circuits are configured to apply a respective one of said first and second output signals only when said third output signal has a state opposite to a state of a respective enabling signal coupled to a respective one of said first and second switching circuits.

16. A circuit as in claim 12, further comprising first and second inverters each having an input coupled to said third output signal, said first inverter having an output coupled as an enabling control signal to said first switching circuit, and said second inverter having an output coupled as an enabling control signal to said second switching circuit.

17. A circuit as in claim 16, wherein said first and second inverters are skewed inverters such that each of said first and second inverter outputs transition logic states approximately as soon as a respective inverter input voltage varies from an initial voltage.

18. A circuit as in claim 16, wherein said first and second inverters are skewed inverters such that each of said first and second inverter outputs transition logic states approximately when a respective inverter input voltage varies nearer to a final voltage from an initial voltage at said inverter input.

19. A circuit as in claim 16, wherein said first switching circuit includes a selective application transistor controlled by said first inverter output and said third output signal.

20. A circuit as in claim 19, wherein said gate of said selective application transistor is coupled to a second reference voltage source having a voltage within said first voltage range through a first enable transistor having a gate coupled to said first inverter output.

21. A circuit as in claim 20, wherein said gate of said selective application transistor is coupled to a first reference voltage source through a second enable transistor having a gate coupled to said third output signal.

22. A circuit as in claim 12, wherein said third logic circuit includes first and second driving transistors, said first driving transistor being a p-channel transistor, and said second driving transistor being an n-channel transistor, said first and second driving transistors being serially connected with the series connection providing the output of said third logic circuit.

23. A circuit as in claim 22, further comprising a pair of series connected holder transistors coupled between first and second voltages which define said second voltage range, the series connection point of said holder transistors being connected to said output of said third logic circuit.

24. A circuit as in claim 12, wherein said first and second logic circuits are NAND logic gate circuits, and said third logic circuit provides an AND logic function output.

25. A circuit as in claim 12, wherein said first and second logic circuits are NOR logic gate circuits, and said third logic circuit provides an OR logic function output.

26. A memory device, comprising:
   circuitry for storing data; and
   at least one level shifting logic circuit associated with said circuitry, said level shifting logic circuit comprising:
      a first logic circuit responsive to at least one applied logic signal for producing a first output signal which transitions within a first voltage range;
      a second logic circuit responsive to said at least one applied logic signal for producing a second output signal which transitions within said first voltage range;
      a third logic circuit responsive to first and second control signals for providing at an output a third output signal which transitions within a second voltage range different from said first voltage range;
      a first switching circuit for selectively applying said first output signal as said first control signal to said third logic circuit; and
      a second switching circuit for selectively applying said second output signal as said second control signal to said third logic circuit;
      said first and second switching circuits operating such that said third logic circuit does not receive said first and second control signals simultaneously.

27. A memory device as in claim 26, wherein said third logic circuit includes first and second series connected driving transistors, a source of said first driving transistor being coupled to a reference voltage source which defines one endpoint of said second voltage range, and a drain of said second driving transistor being coupled to another reference voltage source which defines another endpoint of said second voltage range.

28. A memory device as in claim 27, wherein said first and second switching circuits are configured to apply said first and second output signals in a non-overlapping manner such that said first and second driving transistors are not turned on at the same time.

29. A memory device as in claim 28, wherein each of said first and second switching circuits are configured to apply a respective one of said first and second output signals only when said third output signal has a state opposite to a state of a respective enabling signal coupled to a respective one of said first and second switching circuits.

30. A memory device as in claim 26, further comprising first and second inverters each having an input coupled to said third output signal, said first inverter having an output coupled as an enabling control signal to said first switching circuit, and said second inverter having an output coupled as an enabling control signal to said second switching circuit.

31. A memory device as in claim 30, wherein said first and second inverters are skewed inverters such that each of said first and second inverter outputs transition logic states approximately as soon as a respective inverter input voltage varies from an initial voltage.

32. A memory device as in claim 30, wherein said first and second inverters are skewed inverters such that each of said first and second inverter outputs transition logic states approximately when a respective inverter input voltage varies nearer to a final voltage from an initial voltage at said inverter input.

33. A memory device as in claim 30, wherein said first switching circuit includes a selective application transistor controlled by said first inverter output and said third output signal.

34. A memory device as in claim 33, wherein said gate of said selective application transistor is coupled to a second reference voltage source having a voltage within said first voltage range through a first enable transistor having a gate coupled to said first inverter output.

35. A memory device as in claim 34, wherein said gate of said selective application transistor is coupled to a first reference voltage source through a second enable transistor having a gate coupled to said third output signal.

36. A memory device as in claim 26, wherein said third logic circuit includes first and second driving transistors, said first driving transistor being a p-channel transistor, and said second driving transistor being an n-channel transistor, said first and second driving transistors being serially connected with the series connection providing the output of said third logic circuit.

37. A memory device as in claim 36, further comprising a pair of series connected holder transistors coupled between first and second voltages which define said second voltage range, the series connection point of said holder transistors being connected to said output of said third logic circuit.

38. A memory device as in claim 26, wherein said first and second logic circuits are NAND logic gate circuits, and said third logic circuit provides an AND logic function output.

39. A memory device as in claim 26, wherein said first and second logic circuits are NOR logic gate circuits, and said third logic circuit provides an OR logic function output.

40. A processor system, comprising:
   a processor;
   at least one memory device coupled to said processor, at least one of said memory device and said processor including at least one level shifting logic circuit comprising:
      a first logic circuit responsive to at least one applied logic signal for producing a first output signal which transitions within a first voltage range;
      a second logic circuit responsive to said at least one applied logic signal for producing a second output signal which transitions within said first voltage range;
      a third logic circuit responsive to first and second control signals for providing at an output a third output signal which transitions within a second voltage range different from said first voltage range;
      a first switching circuit for selectively applying said first output signal as said first control signal to said third logic circuit; and
      a second switching circuit for selectively applying said second output signal as said second control signal to said third logic circuit;
      said first and second switching circuits operating such that said third logic circuit does not receive said first and second control signals simultaneously.

41. A system as in claim 40, wherein said third logic circuit includes first and second series connected driving transistors, a source of said first driving transistor being coupled to a reference voltage source which defines one endpoint of said second voltage range, and a drain of said second driving transistor being coupled to another reference voltage source which defines another endpoint of said second voltage range.

42. A system as in claim 41, wherein said first and second switching circuits are configured to apply said first and second output signals in a non-overlapping manner such that said first and second driving transistors are not turned on at the same time.

43. A system as in claim 42, wherein each of said first and second switching circuits are configured to apply a respective one of said first and second output signals only when said third output signal has a state opposite to a state of a respective enabling signal coupled to a respective one of said first and second switching circuits.

44. A system as in claim 40, further comprising first and second inverters each having an input coupled to said third output signal, said first inverter having an output coupled as an enabling control signal to said first switching circuit, and said second inverter having an output coupled as an enabling control signal to said second switching circuit.

45. A system as in claim 44, wherein said first and second inverters are skewed inverters such that each of said first and second inverter outputs transition logic states approximately as soon as a respective inverter input voltage varies from an initial voltage.

46. A system as in claim 44, wherein said first and second inverters are skewed inverters such that each of said first and second inverter outputs transition logic states approximately when a respective inverter input voltage varies nearer to a final voltage from an initial voltage at said inverter input.

47. A system as in claim 44, wherein said first switching circuit includes a selective application transistor controlled by said first inverter output and said third output signal.

48. A system as in claim 47, wherein said gate of said selective application transistor is coupled to a second reference voltage source having a voltage within said first voltage range through a first enable transistor having a gate coupled to said first inverter output.

49. A system as in claim 48, wherein said gate of said selective application transistor is coupled to a first reference voltage source through a second enable transistor having a gate coupled to said third output signal.

50. A system as in claim 40, wherein said third logic circuit includes first and second driving transistors, said first driving transistor being a p-channel transistor, and said second driving transistor being an n-channel transistor, said first and second driving transistors being serially connected with the series connection providing the output of said third logic circuit.

51. A system as in claim 50, further comprising a pair of series connected holder transistors coupled between first and second voltages which define said second voltage range, the series connection point of said holder transistors being connected to said output of said third logic circuit.

52. A system as in claim 40, wherein said first and second logic circuits are NAND logic gate circuits, and said third logic circuit provides an AND logic function output.

53. A system as in claim 40, wherein said first and second logic circuits are NOR logic gate circuits, and said third logic circuit provides an OR logic function output.

54. A method of operating a logic circuit, comprising:
   providing first and second logic output signals transitioning within a first voltage range in response to at least one input logic signal which transitions within said first voltage range;
   providing at a logic circuit a third logic output signal which transitions within a second voltage range which differs from said first voltage range in response to first and second control signals applied as inputs to said logic circuit; and
   selectively applying said first and second logic output signals as said first and second control signals to said logic circuit in a manner which prevents simultaneous application of said first and second control signals to said logic circuit.

55. A method as in claim 54, further comprising holding a state of said third logic output signal using a p-channel transistor coupled between a first reference voltage defining one endpoint of said second voltage range and said third logic output, and an n-channel transistor coupled between a second reference voltage defining another endpoint of said second voltage range and said third output signal line.

56. A method as in claim 54, wherein said first and second logic output signals are applied in a non-overlapping manner such that said first and second control signals are not applied to the logic circuit at the same time.

57. A method as in claim 54, wherein said first and second logic output signals represent a NAND function with respect to said input logic signals, and said third logic output provides an AND logic function output.

58. A method as in claim 54, wherein said first and second logic output signals represent a NOR function with respect to said input logic signals, and said third logic output provides an OR logic function output.

59. A method of logic circuit operation with inherent voltage level shifting, comprising:

providing a pair of inputs transitioning within a first voltage range to a first logic gate;

providing said pair of inputs to a second logic gate;

selectively coupling an output of said first logic gate to a gate of a first large output transistor using a first enabling circuit;

selectively coupling an output of said second logic gate to a gate of a second large output transistor using a second enabling circuit;

generating a third output signal that transitions within a second voltage range by connecting a first source/drain of each of said first and second large output transistors to an output terminal and coupling a second source/drain of each of said first and second large output transistors to first and second respective reference voltage sources;

inverting said third output signal to generate an input to said first and second enabling circuits;

wherein for a low-to-high state change of said third output signal, configuring said first enabling circuit to couple the output of said first logic gate to said gate of said first large output transistor and configuring the second enabling circuit to de-couple the output of said second logic gate from said gate of said second large output transistor; and wherein for a high-to-low state change of said third output signal, configuring said first enabling circuit to de-couple the output of said first logic gate from said gate of said first large output transistor and configuring the second enabling circuit to couple the output of said second logic gate to said gate of said second large output transistor.

60. A method as in claim 59, further comprising holding a state of said third output signal using a plurality of small holder transistors, a first of said holder transistors being a p-channel transistor coupled between said first reference voltage source and said third output signal line and having a gate coupled to said input to said first enabling circuit, and a second of said holder transistors being an n-channel transistor coupled between said second reference voltage source and said third output signal line and having a gate coupled to said output of said first logic gate.

61. A method as in claim 59, wherein said first and second enabling circuits are configured to apply said first and second logic gate output signals in a non-overlapping manner such that said first and second large output transistors are not turned on at the same time.

62. A method as in claim 59, wherein said first and second logic gates perform a NAND function, and said third logic circuit provides an AND logic function output.

63. A method as in claim 59, wherein said first and second logic gates perform a NOR function, and said third logic circuit provides an OR logic function output.

* * * * *

UNITED STATES PATENT AND TRADEMARK OFFICE
CERTIFICATE OF CORRECTION

PATENT NO.     : 6,639,424 B2                                                    Page 1 of 1
DATED          : October 28, 2003
INVENTOR(S)    : Tim Bales It is certified that error appears in the above-identified patent and that said Letters Patent is hereby corrected as shown below:

Column 10,
Line 59, reads "tune" should read -- time --.

Signed and Sealed this

Seventeenth Day of February, 2004

JON W. DUDAS
*Acting Director of the United States Patent and Trademark Office*